(12) United States Patent
Lee et al.

(10) Patent No.: US 7,929,369 B2
(45) Date of Patent: Apr. 19, 2011

(54) SEMICONDUCTOR MEMORY DEVICE HAVING REFRESH CIRCUIT AND WORD LINE ACTIVATING METHOD THEREFOR

(75) Inventors: Dong-Hyuk Lee, Seoul (KR); Chi-Sung Oh, Gunpo-si (KR)

(73) Assignee: Samsung Electronics Co., Ltd., Seoul (KR)

( * ) Notice: Subject to any disclaimer, the term of this patent is extended or adjusted under 35 U.S.C. 154(b) by 54 days.

(21) Appl. No.: 12/453,164

(22) Filed: Apr. 30, 2009

(65) Prior Publication Data

US 2009/0296510 A1 Dec. 3, 2009

(30) Foreign Application Priority Data

May 30, 2008 (KR) ........................ 10-2008-0050769

(51) Int. Cl.
*G11C 7/00* (2006.01)
(52) U.S. Cl. .................................. 365/222; 365/230.06
(58) Field of Classification Search .................. 365/222, 365/230.06
See application file for complete search history.

(56) References Cited

U.S. PATENT DOCUMENTS

| 5,608,682 | A | 3/1997 | Jinbo et al. |
| 5,715,206 | A | 2/1998 | Lee et al. |
| 6,944,081 | B2 | 9/2005 | Takahashi et al. |
| 7,170,808 | B2 * | 1/2007 | Hokenmaier ................. 365/222 |
| 7,177,220 | B2 * | 2/2007 | Chou et al. ................... 365/222 |
| 7,317,650 | B2 * | 1/2008 | Shinozaki et al. ............ 365/222 |
| 7,466,617 | B2 * | 12/2008 | Luk et al. ...................... 365/222 |
| 2002/0093864 | A1 * | 7/2002 | Ooishi ........................... 365/222 |

* cited by examiner

*Primary Examiner* — Michael T Tran
(74) *Attorney, Agent, or Firm* — Harness, Dickey & Pierce

(57) ABSTRACT

A semiconductor memory device includes a memory cell array having at least one memory bank. The memory bank being divided into memory blocks such that the memory blocks have a block position including at least one edge memory block at an edge of the memory bank and at least one non-edge memory block. Each memory block includes a plurality of memory cells. Each memory cell associated with at least one bit line and at least one word line. The semiconductor memory device includes a refresh execution circuit configured to activate a less than or equal number of word lines one at a time during a refresh operation for the memory cells in the edge memory block as activated one at a time during a refresh operation for the memory cells in the non-edge memory block.

19 Claims, 13 Drawing Sheets

SEMICONDUCTOR MEMORY DEVICE HAVING REFRESH CIRCUIT AND WORD LINE ACTIVATING METHOD THEREFOR

PRIORITY STATEMENT

This application claims priority under 35 U.S.C. §119 to Korean Patent Application No. 2008-0050769, filed on May 30, 2008, in the Korean Intellectual Property Office (KIPO), the entire contents of which is incorporated herein by reference.

BACKGROUND

Description of the Related Art

Semiconductor memory devices e.g. dynamic random access memory have increasingly become high speed and highly integrated according user requirements. A dynamic random access memory device having one access transistor and one storage capacitor as a unit memory cell is often employed as a main memory device for electronic systems.

Over time, the charge stored in the storage capacitor gradually discharges as a leakage current. When the charge amount stored in the storage capacitor is discharged below a default value, the sense amplifier may not sense data stored in the memory cell and thus a loss of data occurs. A refresh operation may be provided in a semiconductor memory device having a memory cell requiring a refresh. A word line activating operation and the drive operation of the sense amplifier coupled to the bit line of the memory cell may be periodically generated by the refresh operation. As a result, data stored in the memory cell may be read through the sense amplifier and then may be rewritten to a corresponding memory cell without outputting the data.

In DRAM, a refresh operation may be classified as an auto refresh or a self-refresh.

The auto refresh is a refresh operation performed when a refresh command from an outside controller is periodically applied to the semiconductor memory device while the semiconductor memory device performs a read or write operation. When the semiconductor memory device receives an auto refresh command, the semiconductor memory device stops the external operation of read, write or other commands and performs the auto refresh. When the refresh is completed, the semiconductor memory device subsequently continues to perform a previously stopped operation.

In a standby mode, the semiconductor memory device does not perform normal operations (e.g. a read or write operation), a self-refresh may be performed to periodically refresh through the use of a refresh timer without an outside command so as to preserve data stored in the memory cells.

When the auto refresh or self-refresh operation is enabled, an address to access the memory cell is generated in an internal refresh counter unlike read and write operations of normal operation.

To select a memory cell in an auto refresh or self-refresh operation, a word line coupled to the memory cell is activated. This word line enable operation is mainly called a word line activation or row activation by those skilled in the art.

In DRAM having an open bit line structure, a bit line and a complementary bit line are disposed symmetrical to each other on a sense amplifier. Unlike DRAM of a folded bit line type, the number of word lines activated at a time in a refresh operation becomes different according to an adapted position of the memory cell within a memory cell array. For example when a refresh memory cell belongs to an edge cell block as opposed to a central region within the memory cell array, three word lines are activated at a time in view of the open bit line structure characteristic. If a refresh memory cell belongs to the non-edge cell block as opposed to the edge cell block, two word lines are activated at a time.

In other cases, for example, when a refresh memory cell belongs to an edge cell block not a central region within the memory cell array, two word lines are activated at a time, and when belonging to the non-edge cell block, one word line is activated.

When accessing a memory cell belonging to the edge cell block and when accessing a memory cell belonging to the non-edge cell block, during normal operation not during a refresh operation, the number of word lines to be activated differs; the peak current consumed in a semiconductor memory device increases when in the refresh operation, because of the activation of word lines for an edge cell block.

For example, when a semiconductor memory device having an increased peak current, while in a refresh operation, is applied to an insufficiently powered portable electronics device, a serious error could occur in that data in the memory cell is lost due to a momentary power dip caused by the refresh operation.

SUMMARY

Example embodiments relate to semiconductor memory devices, a refresh execution circuit, implementations thereof, and/or methods associated therewith.

In one example embodiment the semiconductor memory device, includes a memory cell array having at least one memory bank. The memory bank being divided into memory blocks such that the memory blocks have a block position including at least one edge memory block at an edge of the memory bank and at least one non-edge memory block. Each memory block includes a plurality of memory cells. Each memory cell associated with at least one bit line and at least one word line. Example embodiments further provide a refresh execution circuit configured to activate a less than or equal number of word lines one at a time during a refresh operation for the memory cells in the edge memory block as activated one at a time during a refresh operation for the memory cells in the non-edge memory block.

In one example embodiment the refresh execution circuit is configured to perform a refresh operation in a semiconductor memory device having a memory cell array. The memory cell includes at least one memory bank having an at least one edge memory block at an edge of the memory bank and an at least one non-edge memory block. Each memory block includes a plurality of memory cells. Each memory cell associated with at least one bit line and at least one word line. The refresh execution circuit includes a cell block position decision circuit configured to determine whether the refresh operation is for the at least one edge memory block or the at least one non-edge memory block based on a refresh address, and to output a cell block position decision signal based on the determination of the block position. The refresh execution circuit includes a counter configured to receive refresh pulses and to count the refresh pulses based on the cell block position decision signal, and configured to output a count based on counting the refresh pulses. The refresh execution circuit includes a multiplexer configured to output one of the count and the refresh pulses based on the cell block position decision signal, and a refresh counting circuit including a plurality of binary counters configured to generate the refresh address based on an output of the multiplexer.

In one example embodiment the data processing system includes a main board, a central processing unit mounted on the main board, and memory device electrically coupled to the central processing unit. The memory device having a memory cell array, the memory cell including at least one memory bank having an at least one edge memory block at an edge of the memory bank and an at least one non-edge memory block, each memory block including a plurality of memory cells, each memory cell associated with at least one bit line and at least one word line, wherein a less than or equal number of word lines one at a time during a refresh operation for the memory cells in the edge memory block as activated one at a time during a refresh operation for the memory cells in the non-edge memory block.

In one example embodiment the semiconductor memory device, includes a memory cell array having at least one memory bank. The memory bank being divided into memory blocks such that the memory blocks have a block position including at least one edge memory block at an edge of the memory bank and at least one non-edge memory block. Each memory block includes a plurality of memory cells. Each memory cell associated with at least one bit line and at least one word line. Example embodiments further provide a method to refresh the semiconductor memory device by activating a less than or equal number of word lines one at a time during a refresh operation for the memory cells in the edge memory block as activated one at a time during a refresh operation for the memory cells in the non-edge memory block.

BRIEF DESCRIPTION OF THE DRAWINGS

Example embodiments will be more clearly understood from the following brief description taken in conjunction with the accompanying drawings.

FIG. 1 is a block diagram of a circuit illustrating a part relating to a refresh operation of DRAM according to an example embodiment;

FIG. 2 illustrates a connection relation between a bit line sense amplifier and bit lines in a general open bit line structure;

FIG. 3 illustrates timings of refresh count pulses according to an example embodiment;

FIG. 4 is a block diagram of a refresh counting circuit according to an example embodiment;

FIG. 5 illustrates operation timings referred to in FIG. 4;

FIG. 6 shows that the number of activated word lines during normal operation becomes different according to an adapted position of memory block in an open bit line structure;

FIG. 7 illustrates a word line activation relating to a center block in a conversion of normal operation to a refresh operation with reference to FIG. 4;

FIG. 8 illustrates a word line activation relating to an edge block in a conversion of normal operation to a refresh operation with reference to FIG. 4;

FIG. 9 illustrates a modification embodiment of FIG. 8; and

FIG. 10 Illustrates word lines and bit lines coupled with memory cells in an open bit line structure according to an example embodiment.

DETAILED DESCRIPTION OF EXAMPLE EMBODIMENTS

Figure 1:
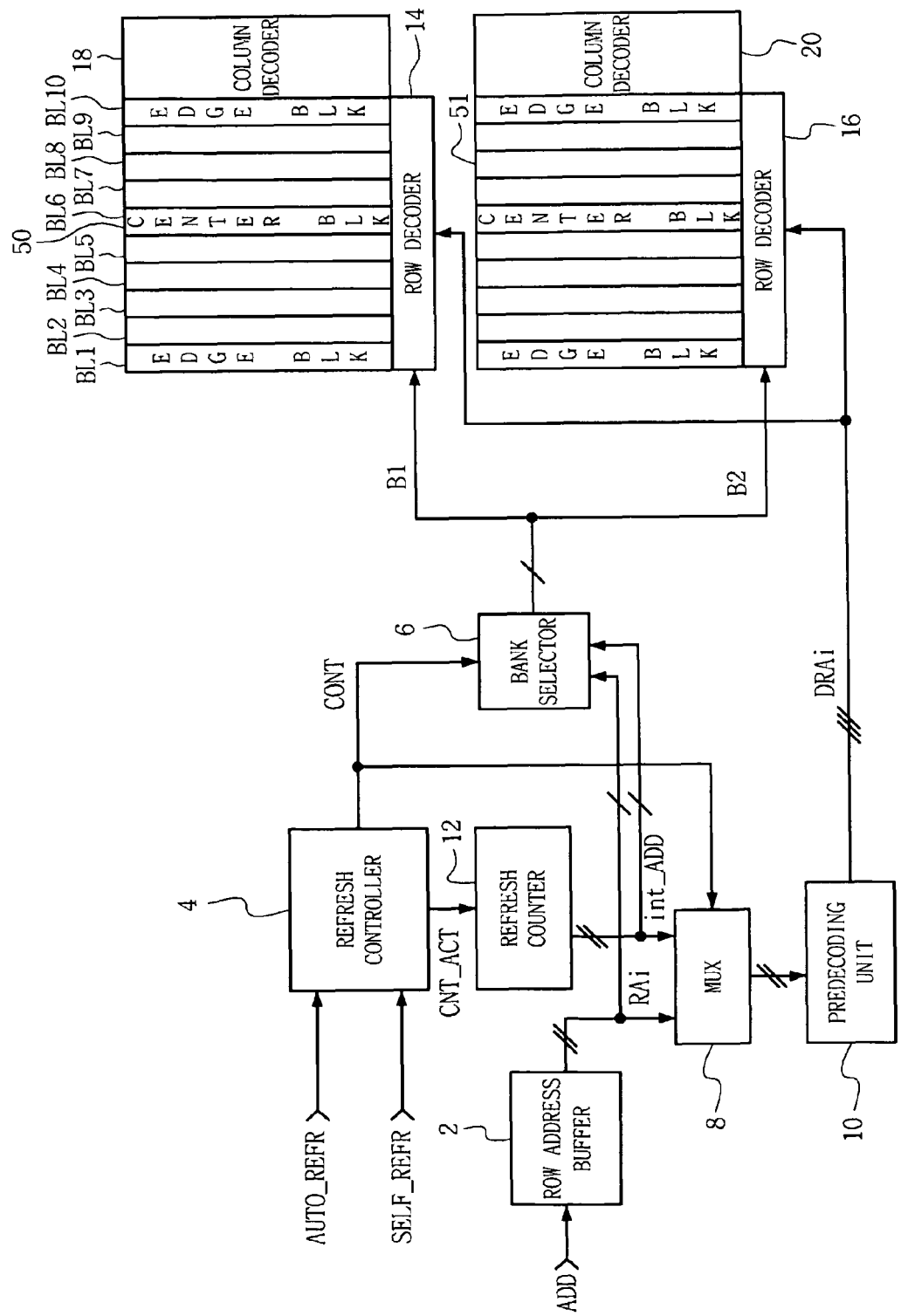
FIGS. 1-10 represent non-limiting, example embodiments as described herein.

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A semiconductor memory device having a refresh circuit to reduce a peak current, and a word line activating method are described as follows according to example embodiments, referring to the accompanying drawings.

Example embodiments herein describe technical characteristics, to reduce a peak current in a refresh operation, the same row activation may be performed for edge cell block and non-edge cell block during a refresh operation, in view of an operation characteristic of an open bit line structure that row activation for the edge cell block and the non-edge cell block may be distinct from each other during normal operation. That is, during a refresh operation, the same number of word lines may be activated regardless of an adapted position of memory block, unlike during a normal operation. Although refresh cycle time increase minimally, the problem of an increased peak current may be solved or mitigated.

FIG. 1 is a block diagram of a circuit relating to the refresh operation of DRAM according to an example embodiment.

Referring to FIG. 1, there is shown a connection configuration of a circuit, including a refresh controller 4, refresh counter 12, row address buffer 2, multiplexer 8, predecoding circuit 10, bank selector 6, memory banks 50 and 51, row decoders 14 and 16, and column decoders 18 and 20. The drawing shows, as an example embodiment, a memory cell array divided into two memory banks 50 and 51. One bank 50 includes a plurality of memory blocks BL1-BL10, and the memory blocks may be called edge memory blocks BL1, BL10 and center memory blocks BL2-BL9 according to an adapted position of the memory blocks within the bank 50. The center memory blocks BL2-BL9 will be called non-edge memory blocks in example embodiments. Each memory block includes a plurality of memory cells, and each memory cell is associated with at least one bit line and at least one word line.

The refresh controller 4 outputs a counting drive signal CNT_ACT and a bank selection and multiplexer control signal CONT in response to an auto refresh signal AUTO_REFR and a self refresh signal SELF_REFR. The refresh counter 12 performs a counting operation in response to the counting drive signal CNT_ACT, thus generating an internal address signal int_ADD used in a refresh operation. The row address buffer 2 buffers and outputs a row address RAi among addresses applied from the outside. The multiplexer (MUX: 8) outputs the internal address signal int_ADD or the row address RAi in response to the multiplexer control signal CONT. The predecoding circuit 10 pre-decodes an address output through the multiplexer 8, and outputs a predecoding row address signal DRAi to a row decoder 14, 16. The bank selector 6 outputs first and second bank selection signals B1, B2 activating one of the row decoders 14 and 16 in response to the bank selection control signal CONT.

In the partial configuration relating to a refresh operation of the DRAM shown in FIG. 1, the row activation for the edge memory blocks BL1 and BL10 and the non-edge memory blocks BL2-BL9 may be performed distinctively during a normal operation, and during a refresh operation, the same row activation for the edge cell blocks BL1 and BL10 and the non-edge cell blocks BL2-BL9 may be performed. For example, the number of word lines activated in the row activation for the edge memory blocks BL1 and BL10 and the non-edge memory blocks BL2-BL9 may be three and two, respectively during normal operation, but during a refresh operation, the number of word lines activated in the row activation for the edge cell blocks BL1 and BL10 and the non-edge cell blocks BL2-BL9 may be the same number, e.g., two.

In other words, the refresh operation may be accomplished by a refresh execution circuit that may be configured to activate a less than or equal number of word lines one at a time during a refresh operation for the memory cells in the edge memory block as activated one at a time during a refresh operation for the memory cells in the non-edge memory block.

According to an example embodiment, the refresh execution circuit is configured to perform the refresh operation on the memory cells in the edge memory block in a first and second stage, and configured to activate a first number of word lines one at a time in the first stage and to activate a second number of word lines one at a time in the second stage, such that each of the word lines addressed is activated during the refresh operation.

For example, the number of word lines activated during the first stage may be equal to, greater than or less than the number of word lines activated during the second stage. The number of word lines activated during the first stage or the second stage, which ever is greater, equals the number of word lines activated one at a time in the non-edge memory block during a refresh operation.

Figure 2:
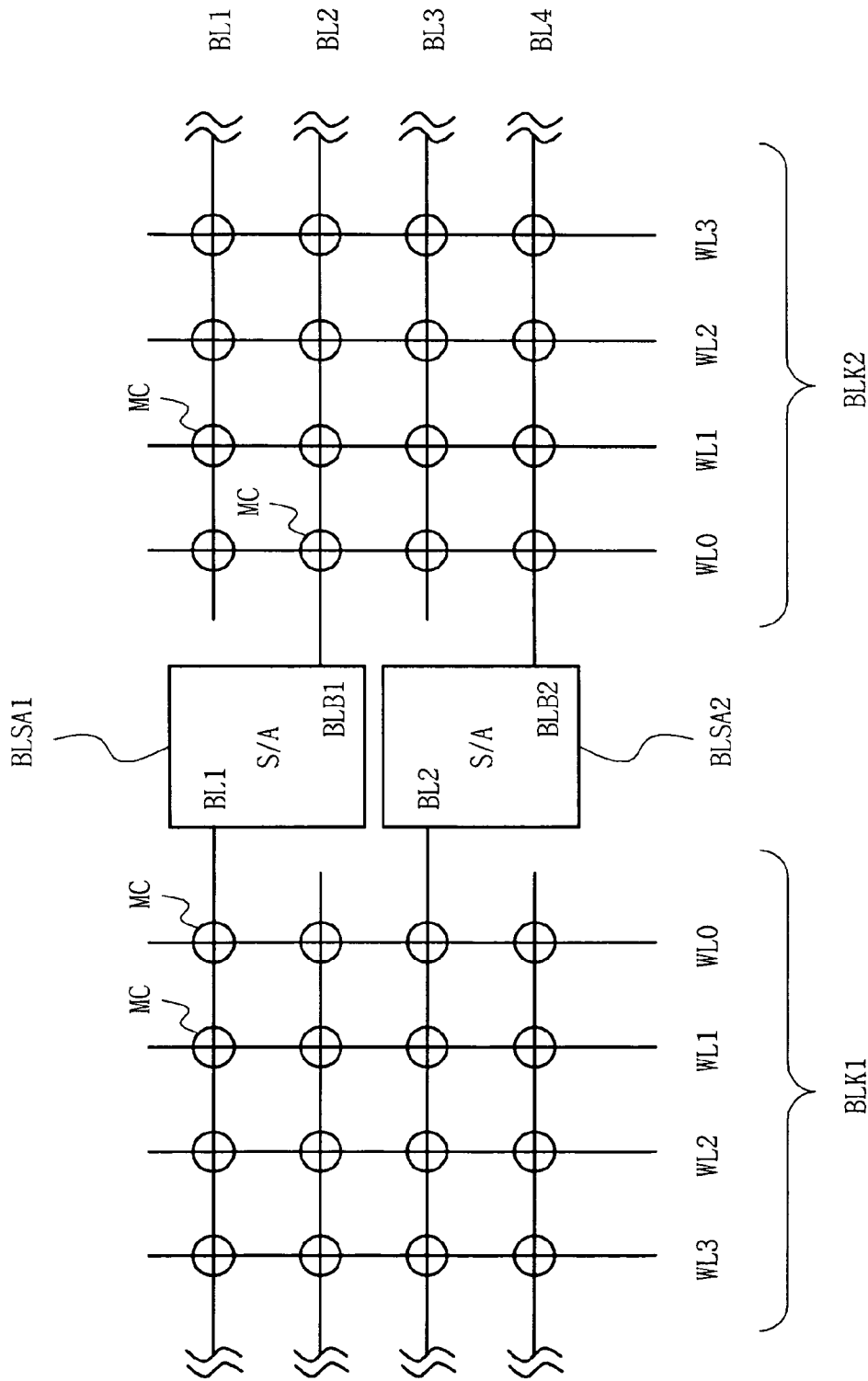

FIG. 2 illustrates a connection relation between a bit line sense amplifier and bit lines in a general open bit line structure. With reference to FIG. 2, bit lines BL1-BL4 may be disposed in a transverse direction, and word lines WL0-WL3 of mutually adjacent memory blocks may be disposed in a length direction. Memory cells MC may be individually coupled with intersections of bit lines BL1-BL4 and word lines WL0-WL3.

A bit line input BL1 of a first bit line sense amplifier BLSA1 may be coupled to a first bit line BL1 of a first memory block BLK1, and a complementary bit line input BLB1 may be coupled to a second bit line BL2 of a second memory block BLK2. Further, a bit line input BL2 of a second bit line sense amplifier BLSA2 may be coupled to a third bit line BL3 of the first memory block BLK1, and a complementary bit line input BLB2 may be coupled to a fourth bit line BL4 of the second memory block BLK2. Thus, when the first bit line sense amplifier BLSA1 senses data on the memory cell coupled to a first bit line BL1 of first memory block BLK1, a second bit line BL2 of the second memory block BLK2 becomes a reference (ref) bit line.

In the open bit line structure of FIG. 2, two inputs of the sense amplifier may be obtained from bit lines of mutually adjacent memory blocks BLK1 and BLK2.

Figure 10:
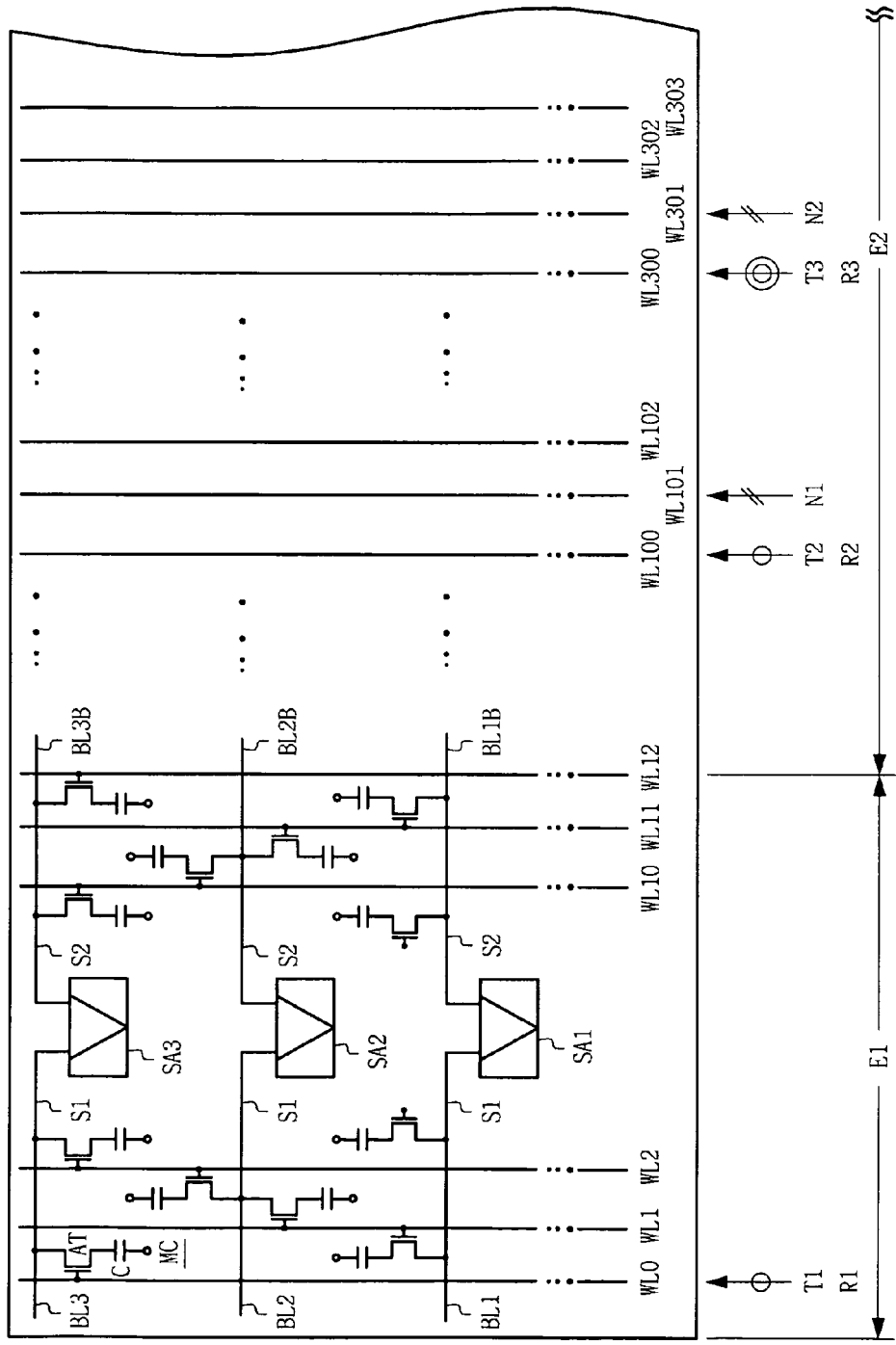

The connection correlation between the bit line sense amplifier and the memory cells in the open bit line structure of FIG. 2 will be more apparent referring to FIG. 10.

FIG. 10 illustrates word lines and bit lines coupled with memory cells in the open bit line structure according to an example embodiment. With reference to FIG. 10, sense amplifiers SA1, SA2 and SA3 may be representatively shown within one memory bank 50. In the drawing, memory cells MC coupled with bit lines BL1-BL3 and word lines WL0-WL2, shown on the left of the sense amplifiers SA1, SA2 and SA3, and memory cells MC coupled with bit lines BL1B-BL3B and word lines WL10-WL12 shown on the right of the sense amplifiers SA1, SA2 and SA3, indicate they belong to the edge cell block BL1 shown in FIG. 1. On the other hand, memory cells belonging to section E2 adjacent to section E1 belong to the non-edge cell block BL2 shown in FIG. 1.

As shown in FIG. 10, in the DRAM having the open bit line structure, the number of word lines activated at a time in a normal operation becomes different according to an adapted position of memory cells within a memory cell array, unlike DRAM of a folded bit line type. This will be more apparent by referring to FIG. 6.

Figure 6:
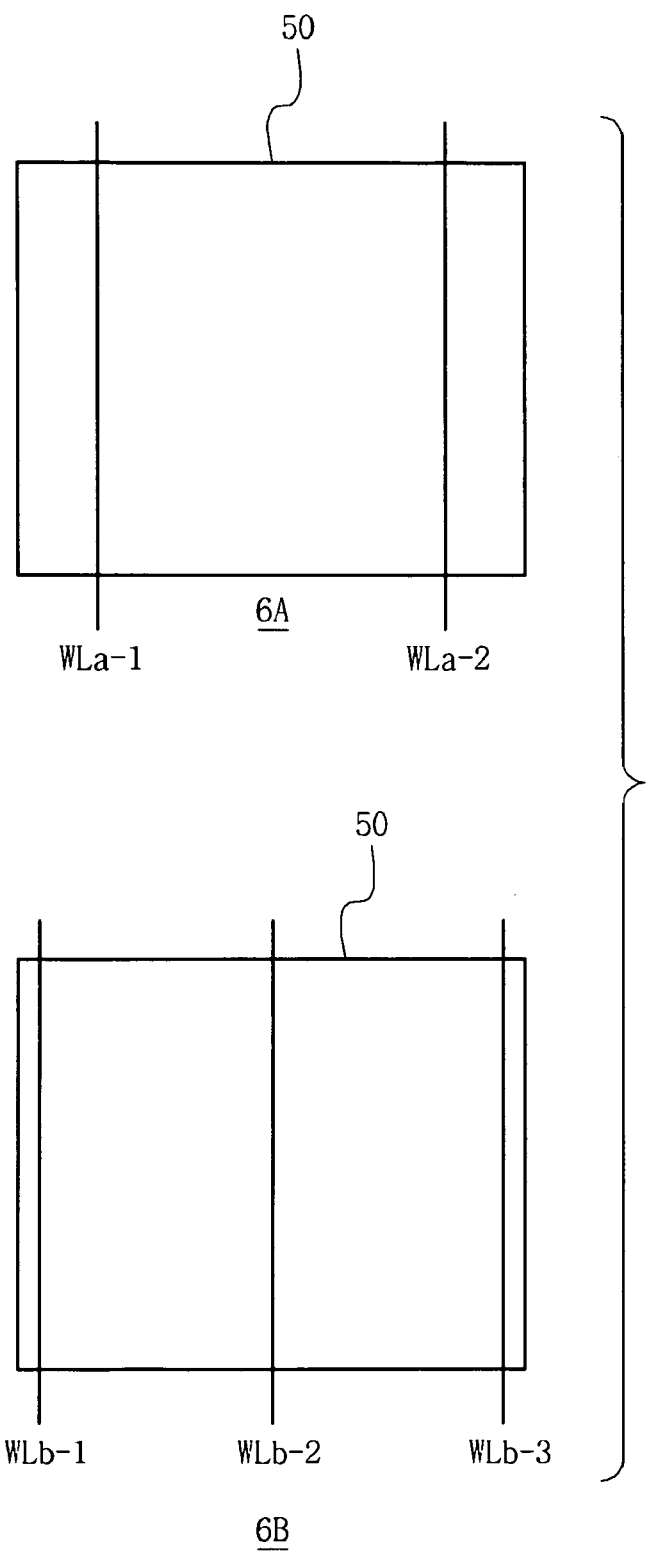

FIG. 6 shows that the number of activated word lines during a normal operation becomes different according to an adapted position of the memory block in the open bit line structure. When within the memory bank 50, a memory cell to be accessed belongs to a non-edge memory block; two word lines WLa-1 and WLa-2 are activated at once as shown in reference number 6A. When a memory cell to be accessed belongs to an edge memory block, three word lines WLb-1, WLb-2 and WLb-3 may be activated at once as shown in reference number 6B.

As another example, for a memory cell belonging to a non-edge memory block, one word line may be activated at once, and for a memory cell belonging to an edge cell block, two word lines may be activated at once.

The number of word lines activated during a refresh operation will be described through a comparison between the existing example and other example embodiments.

According to example embodiments, even though the row activations for the edge cell block and the non-edge cell block may be distinct from each other during a normal operation in view of an operation characteristic of the open bit line structure, the row activations for the edge cell block and the non-edge cell block may be the same as each other during a refresh operation. This will be more apparent from the description of FIGS. 7 and 8.

Figure 4:
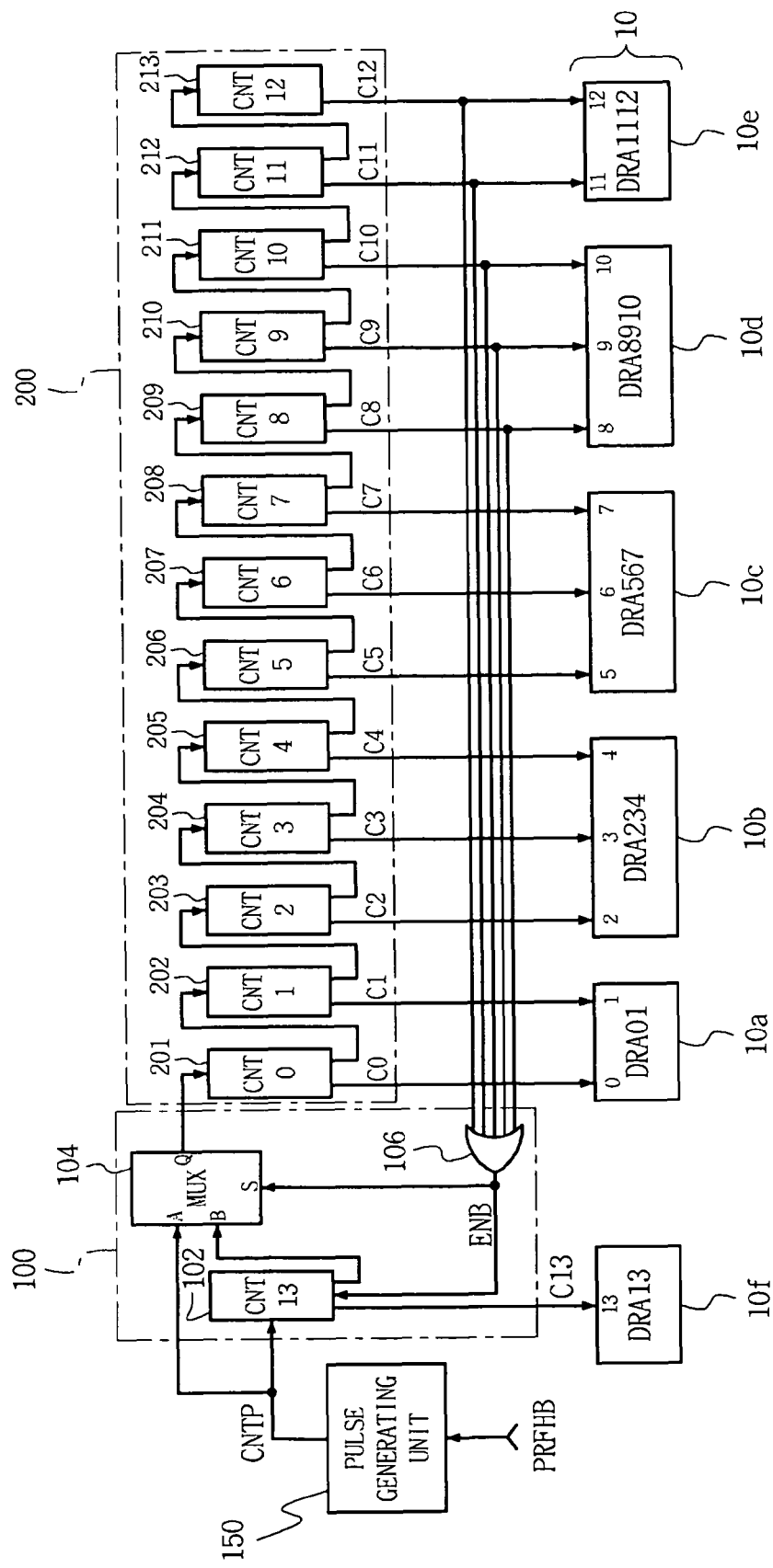
Figure 7:
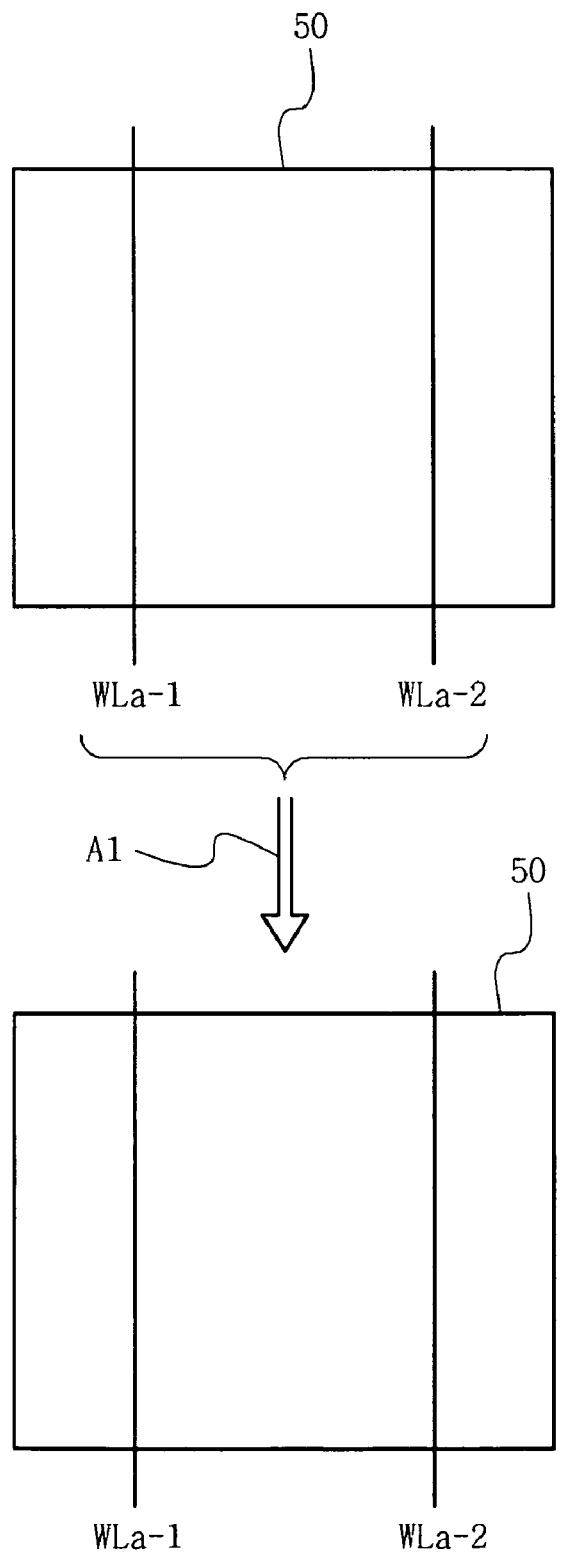

FIG. 7 illustrates a word line activation relating to a center memory block in a conversion from normal operation to a refresh operation with reference to FIG. 4.

Figure 8:
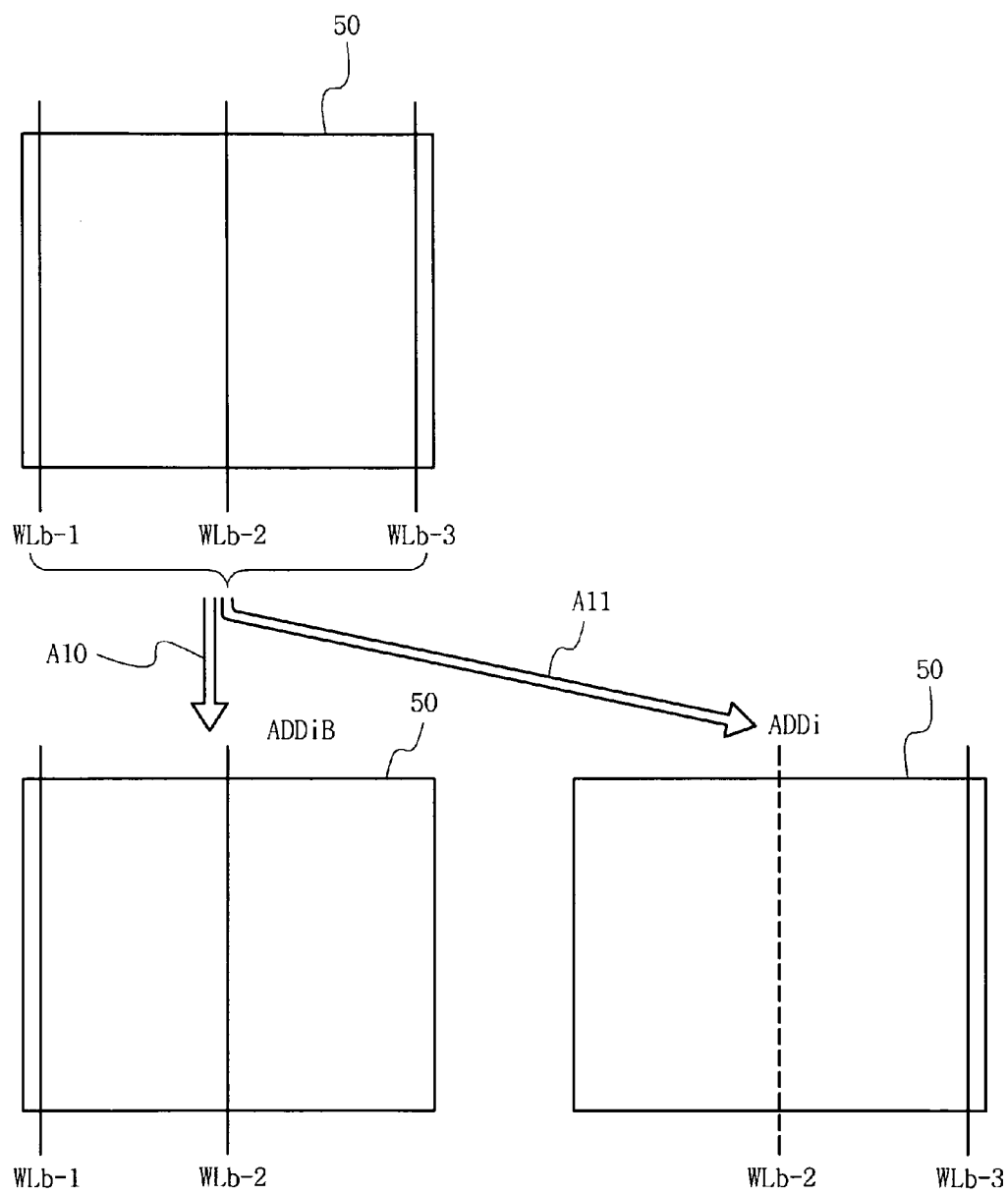

FIG. 8 illustrates a word line activation relating to an edge memory block in a conversion from normal operation to a refresh operation with reference to FIG. 4.

Referring to FIG. 7, when, within the memory bank 50, a memory cell to be accessed belongs to a center memory block as the non-edge cell block, two word lines WLa-1 and WLa-2 may be activated simultaneously either during a normal operation or during a refresh operation. A reference number A1 of FIG. 7 indicates a mode transition from normal operation to refresh operation. Thus, when performing a read or write operation by accessing a memory cell belonging to non-edge cell block, two word lines WLa-1 and WLa-2 may be activated simultaneously; namely, two word lines WLa-1 and WLa-2 may be activated simultaneously as in a refresh operation.

Referring to FIG. 8, when, within the memory bank 50, a memory cell to be accessed belongs to an edge cell block, three word lines WLb-1, WLb-2 and WLb-3 may be activated simultaneously during normal operation, but during a refresh operation, two word lines WLb-1 and WLb-2 may be primarily activated, and subsequently, two word lines WLb-2 and WLb-3 or one word line WLb-3 may be secondarily activated. As a result, two word lines may be activated two times. It does not matter that word line WLb-2 shown in a reference number A11 of FIG. 8 may be activated or inactivated, thus it is represented as a dashed-line in the drawing.

Referring back to FIG. 10, reference numbers N1 and N2 in a section E2 indicate an activation of word lines corresponding to two word lines WLa-1 and WLa-2 shown in FIG. 7. When memory cells belonging to a non-edge block become the refresh target during the refresh operation, two word lines WL101 and WL301 may be activated simultaneously as shown by the reference numbers N1 and N2. On the other hand, in sections E1 and E2, reference numbers T1, T2 and T3 individually indicate an activation of word lines that correspond to word lines WLb-1, WLb-2 and WLb-3 of FIG. 8. During the refresh operation on memory cells belonging to an edge block, three word lines WL0, WL100 and WL300 may be activated over two times as shown by the reference numbers T1, T2 and T3. That is, first, two word lines WL0 and WL100 may be activated and the refresh operation may be performed. Then, second, word line WL300 and, optionally word line WL100 may be activated and the refresh operation is again performed. As shown by the reference numbers T1, T2 and T3, three word lines may be used in refresh operations, and are thus represented by refresh initial reference numbers R1, R2 and R3.

According to example embodiments, to reduce a peak current in the refresh operation the number of activated word lines may be limited to a maximum of two as shown in FIG. 8. In a semiconductor memory device that may have predecoding addresses provided as DRA0 to DRA13, the refresh operation may be performed over two times as shown in reference numbers A10 and A11 of FIG. 8; the refreshed-number increases by 1/32 and a refresh cycle time increase minimally, but peak current may be reduced. For example, when refresh cycle time is 64 ms and the refreshed number increases by 1/32, refresh cycle time becomes 64 ms×33/32=66 ms. However, two word lines are enabled in the refresh operation as shown in FIGS. 7 and 8, thus a peak current in the refresh operation may be substantially reduced and an optimized design for a capacity of high voltage VPP may become easier.

Figure 9:
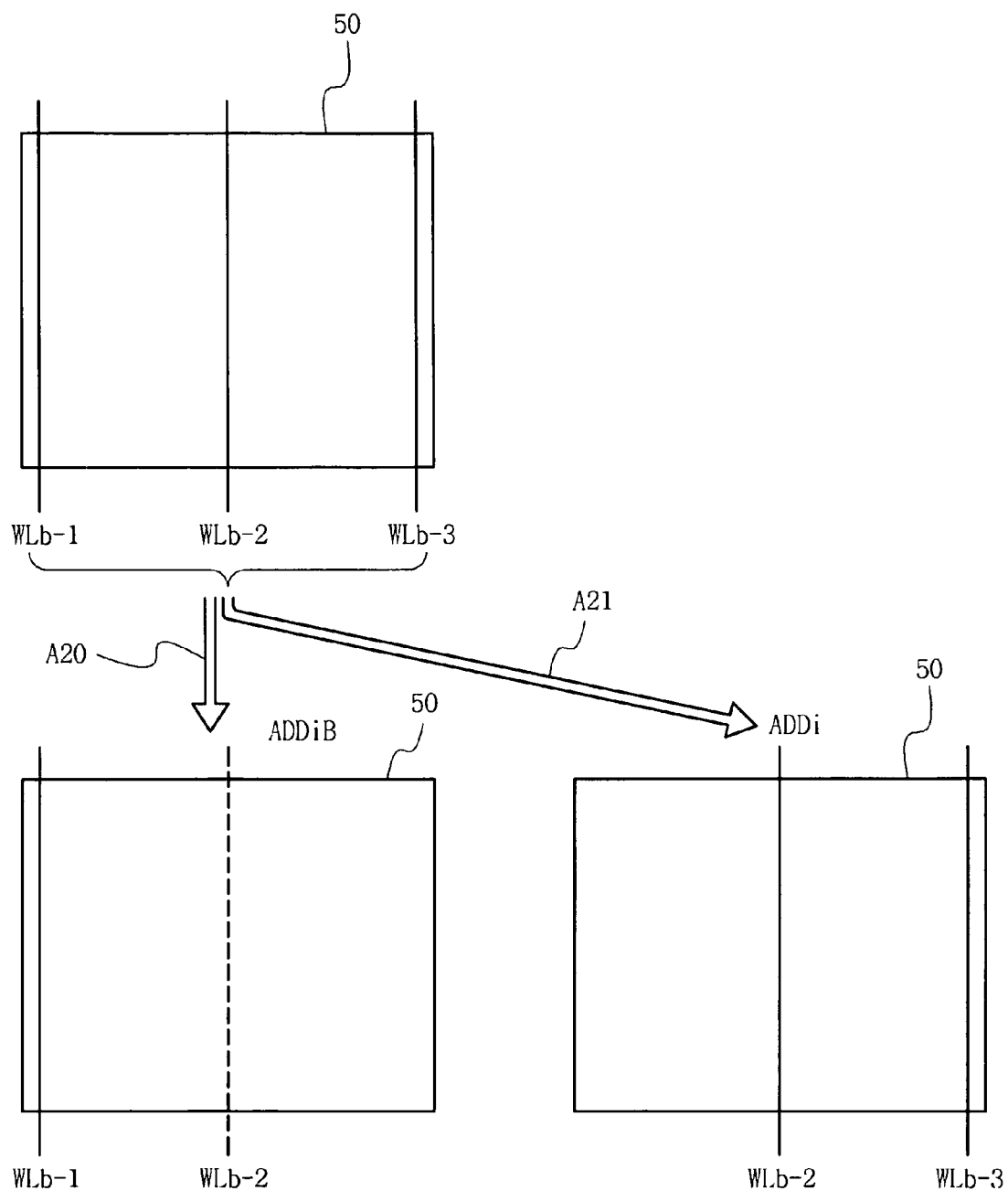

FIG. 9 illustrates a modified embodiment of FIG. 8 and provides a scheme where one or two word lines may be first activated and secondarily two word lines may be activated. In this embodiment, the reduction effect of peak current may be obtained as with the embodiment of FIG. 8.

Figure 5:
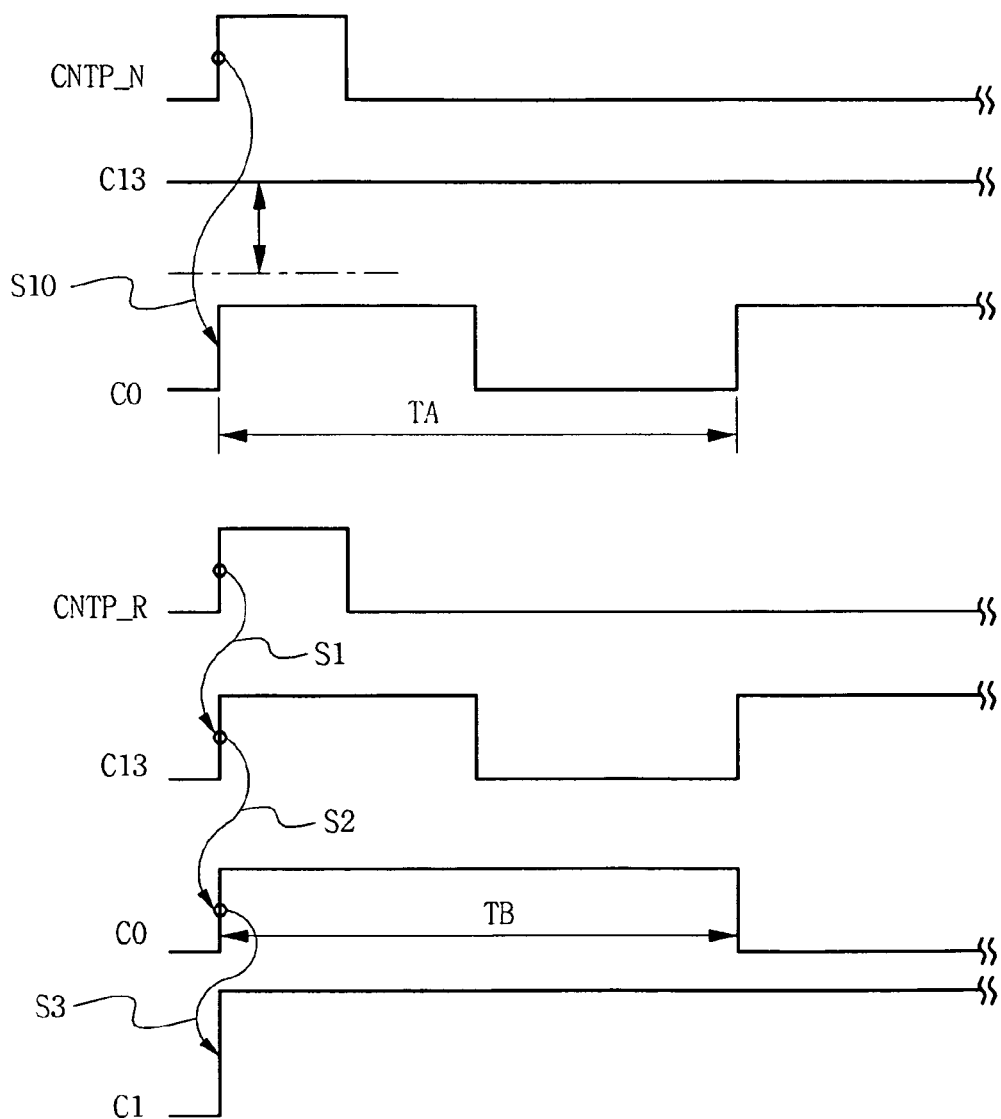

As described above with reference to FIGS. 7 to 9, it will be described, by referring to FIGS. 3 to 5; how to perform the same row activation for the edge cell block and the non-edge cell block during the refresh operation, given that row activations for the edge cell block and non-edge cell block may be performed distinctively during a normal operation.

Figure 3:
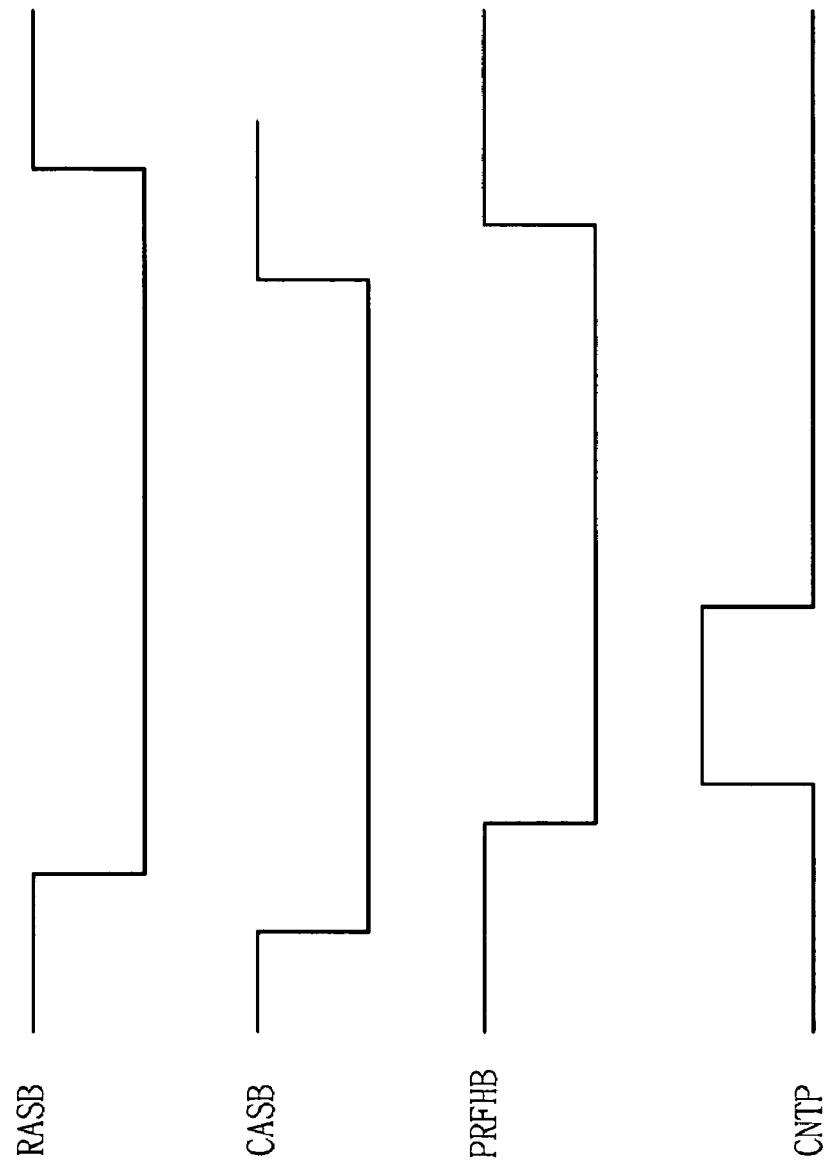

FIG. 3 illustrates timings of refresh count pulses according to an example embodiment, and FIG. 4 is a block diagram of a refresh counting circuit according to an example embodiment. FIG. 5 illustrates operation timings referred to in FIG. 4.

Referring to FIG. 4, a refresh circuit includes a pulse generating circuit 150, a refresh counting circuit 200 and a counting increase switching circuit 100. The refresh circuit may have other functions in addition to the functions of the refresh counter 12 shown in FIG. 1.

In the refresh circuit of FIG. 4, it may be determined whether a refresh memory cell requiring a refresh operation belongs to an edge cell block or non-edge cell block based on an adapted position of the circuit memory cell requiring the refresh (e.g., as indicated by an address); and the refresh circuit may be applied more usefully to a semiconductor memory device including a memory cell array of a memory bank structure where the circuit memory cells are at intersects of corresponding word lines and bit lines.

The pulse generating circuit 150 logically combines refresh signal PRFHB, inverted row address strobe signal RASB and inverted column address strobe signal CASB shown in FIG. 3, and generates a refresh pulse CNTP as in FIG. 3.

The refresh counting circuit 200 may include binary counters 201-213 according to an example embodiment, and generates a refresh address by counting the refresh pulse CNTP. The refresh addresses C0-C12 may be provided as inputs of unit pre-decoders 10a-10e constituting the pre-decoding circuit 10 of FIG. 1.

The counting increase switching circuit 100 decides whether a refresh memory cell belongs to the edge cell block or non-edge cell block during the refresh operation, and performs the function of increasing the refresh address belonging to the edge cell block.

The counting increase switching circuit 100 includes a cell block position decision circuit 106 to decide whether the refresh memory cell belongs to the edge cell block or non-edge cell block and to output a cell block position decision signal; a counter 102 to count the refresh pulse in response to an activation of the cell block position decision signal; and a multiplexer 104 to provide an output of the counter as an input to the refresh counting circuit in an activation of the cell block position decision signal and to provide the refresh pulse as an input to the refresh counting circuit in an inactivation.

According to an example embodiment, the cell block position decision circuit 106 may be coupled with a plurality of output terminals C8-C12 of unit counters 209-213 of the refresh counting circuit 200, and realized as an OR gate generating an OR response to output signals of the output terminals of the counters 209-313, and outputting the OR response as the cell block position decision signal ENB.

Examples for operation of the counting increase switching circuit 100 are described as follows, referring to FIG. 5.

In FIG. 4, when an output ENB of the OR gate 106 has a low level, this indicates a refresh target is a non-edge cell block. In this case, the counter 102 may be disabled, and the multiplexer 104 provides an input to input terminal A as an output of its output terminal Q. Thus, unit counter 201 counts the refresh pulse CNTP. In this case, like a state transition reference number S10 of FIG. 5, an output C0 of the unit counter 201 may be represented as a pulse like cycle TA. Here, an output C13 of the counter 102 may be determined to maintain a high level intact.

When a memory cell block as the refresh target is changed to an edge cell block, the output ENB of the OR gate 106 becomes a high level. As a result, the counter 102 is enabled, and the multiplexer 104 provides an input to input terminal B as an output of output terminal Q. Thus the unit counter 201 counts a counting output of the counter 102. In this case, like in state transition reference numbers S1, S2 and S3 of FIG. 5, a series of operations occur and an output C0 of the unit counter 201 may be represented as a pulse like a half-cycle TB. Here, the half-cycle TB becomes the same as a time interval of the cycle TA. This is why the unit counter 201 does not count the refresh pulse CNTP, but counts an output pulse of the counter 102 having a cycle twice that of the refresh pulse.

As described above, in refreshing an edge cell block, the function of activating two Word lines twice without 'don't care' for DRA13 may be realized through the refresh circuit.

In other words, the cell block position decision circuit 106 performs a logical OR operation on a portion of outputs from the binary counters to generate the cell block position decision signal.

A refresh cycle time increases a little by increasing the refreshed number for an edge cell block, but peak current may be reduced. For example, when a refresh cycle time of one time is 64 ms and when the refreshed number increases by 1/32, it becomes 64 ms×33/32=66 ms such that there is a small refresh cycle time increase corresponding to a level of 2 ms. Two word lines are enabled in the refresh operation, thereby substantially reducing the peak current of refresh operation and reducing the size of the high voltage (VPP) generating circuit.

It may be determined that a refresh memory cell belongs to an edge cell block or non-edge cell block according to an adapted position of unit memory cell requiring a refresh operation. A word line activating method in a refresh operation of a semiconductor memory device including a memory cell array of a memory bank structure that the unit memory cells are at intersections of corresponding word lines and bit lines, may include the following operations.

Whether a refresh memory cell belongs to the edge cell block or non-edge cell block is decided. The number of activated word lines becomes the same as the number of word lines activated in a refresh operation for the non-edge cell block by separately performing the refresh operation when the refresh memory cell belongs to the edge cell block.

These operations may be realized through a refresh circuit as shown in FIG. 4 and described above.

In employing a volatile semiconductor memory device in a data processing system including a main board and a central processing unit (CPU) mounted on the main board, the volatile semiconductor memory device having a refresh circuit as shown in FIG. 4, may have increased reliability and power may be saved.

As described above, two banks were adapted within a memory cell array; however, the present invention is not limited to two banks. Four, eight, etc. banks may be included in the memory cell array. When applied to a DDR3 having an 8 bit prefetch scheme, the capacity of the memory cell array may be designed with the capacity of 2 Gbit. On the other hand, in a DDR2, the memory cell array may include four banks.

As described above, according to at least one example embodiment, unlike the normal operation, the same number of word lines may be activated regardless of an adapted position of memory block during a refresh operation. Accordingly peak current may be reduced during a refresh operation.

A semiconductor memory device applied to an inventive embodiment may have a memory array structure of DDR2 type, DDR3 type, and the data processing system having a semiconductor memory device may be portable electronic appliances such as a personnel computer, notebook computer, HHP or PMP etc.

Figure 11:
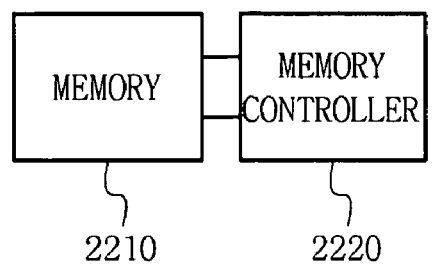
FIGS. 11-16 illustrate example embodiments of applications of the semiconductor device It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

FIG. 11 illustrates an example embodiment of an application of the semiconductor device. As shown, this embodiment includes a memory 2210 connected to a memory controller 2220. The memory 2210 may be any of the semiconductor device embodiments described above. The memory controller 2220 supplies the input signals for controlling operation of the memory 2210. For example, the memory controller 2220 supplies the command CMD and address signals.

Figure 12:
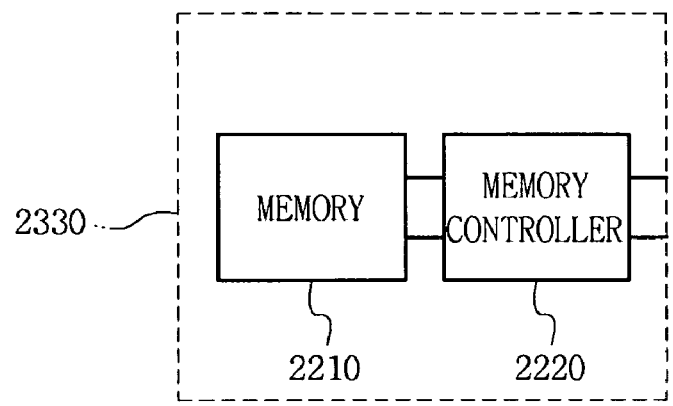

FIG. 12 illustrates yet another embodiment. This embodiment is the same as the embodiment of FIG. 11, except that the memory 2210 and memory controller 2220 have been embodied as a card 2330. For example, the card 2330 may be a memory card such as a flash memory card. Namely, the card 2330 may be a card meeting any industry standard for use with a consumer electronics device such as a digital camera, personal computer, etc. It will be appreciated that the memory controller 2220 may control the memory 2210 based on controls signals received by the card 2330 from another (e.g., external) device.

Figure 13:
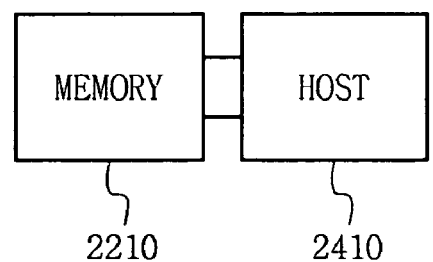

FIG. 13 illustrates a still further embodiment of the present invention. As shown, the memory 2210 may be connected with a host system 2410. The host system 2410 may be a processing system such as a personal computer, digital camera, etc. The host system 2410 may use the memory 2210 as a removable storage medium. As will be appreciated, the host system 2410 supplies the input signals for controlling operation of the memory 2210. For example, the host system 2410 supplies the command CMD and address signals.

Figure 14:
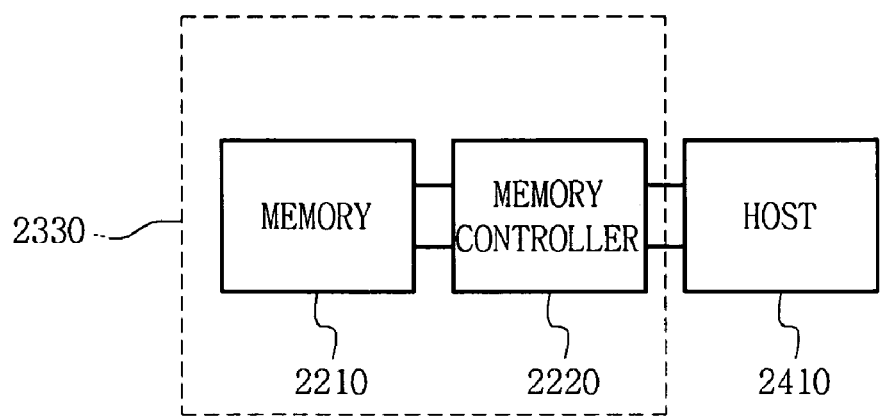

FIG. 14 illustrates an embodiment of the present invention in which the host system 2410 is connected to the card 2330 of FIG. 12. In this embodiment, the host system 2410 applies control signals to the card 2330 such that the memory controller 2220 controls operation of the memory 2210.

Figure 15:
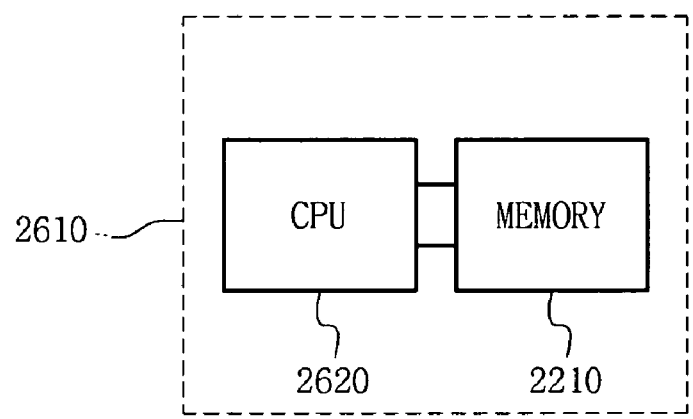

FIG. 15 illustrates a further embodiment of the present invention. As shown, the memory 2210 may be connected to a central processing unit (CPU) 2620 within a computer system 2610. For example, the computer system 2610 may be a personal computer, personal data assistant, etc. The memory 2210 may be directly connected with the CPU 2620, connected via bus, etc. It will be appreciated, that FIG. 15 does not illustrate the full complement of components that may be included within a computer system 2610 for the sake of clarity.

Figure 16:
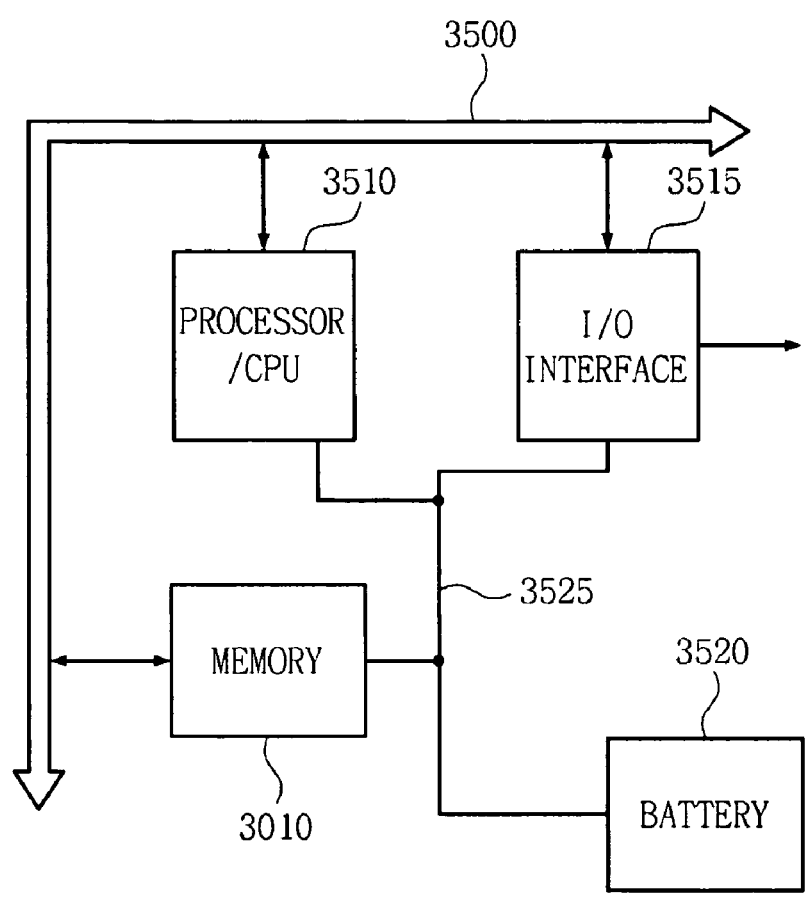

FIG. 16 illustrates another embodiment of the present invention. FIG. 16 may represent another portable application of the semiconductor device embodiments described above. As shown, this embodiment includes the memory 3010, which may be any of the semiconductor device embodiments described above. In this and any of the previous embodiments, the memory 3010 may include one or more integrated circuit dies where each die has a memory array that operates according to the various embodiments. These IC dies may be separate, stand alone memory devices that are arranged in modules such as conventional dynamic random access memory (DRAM) modules, or they may be integrated with other on-chip functionalities. In the latter embodiments, the memory 3010 may be part of an I/O processor or a microcontroller as described above.

This and the other portable application embodiments may be for instance a portable notebook computer, a digital still and/or video camera, a personal digital assistant, a mobile (cellular) hand-held telephone unit, navigation device, GPS system, audio and/or video player, etc. Of course, there are other non-portable applications for the memory 3010. These include, for instance, large network servers or other computing devices which may benefit from a non-volatile memory device.

As shown in FIG. 16, this embodiment includes a processor or CPU 3510 that uses the memory 3010 as program memory to store code and data for its execution. Alternatively, the memory 3010 may be used as a mass storage device for non-volatile storage of code and data. The portable application embodiment may communicate with other devices, such as a personal computer or a network of computers via an I/O interface 3515. This I/O interface 3515 may provide access to a computer peripheral bus, a high speed digital communication transmission line, or an antenna for unguided transmissions. Communications between the processor and the memory 3010 and between the processor 3510 and the I/O interface 3515 may be accomplished using conventional computer bus architectures as represented by bus 3500 in FIG. 16. Furthermore, the present invention is not limited to this architecture. For example, the memory 3010 may be replaced with the embodiment of FIG. 12, and communication with the processor 3510 may be via the memory controller 3020. Furthermore, the I/O interface 3515 may communicate with the memory 3010 via the memory controller 3020, or directly with the memory 3010 if the memory controller 3020 is not present. In portable applications, the above-described components are powered by a battery 3520 via a power supply bus 3525.

While example embodiments have been particularly shown and described, it will be understood by one of ordinary skill in the art that variations in form and detail may be made therein without departing from the spirit and scope of the claims.

What is claimed is:

1. A semiconductor memory device, comprising:
a memory cell array having at least one memory bank, the memory bank being divided into memory blocks such that the memory blocks have a block position including at least one edge memory block at an edge of the memory bank and at least one non-edge memory block, each memory block including a plurality of memory cells, each memory cell associated with at least one bit line and at least one word line; and
a refresh execution circuit configured to activate a less than or equal number of word lines one at a time during a refresh operation for the memory cells in the edge memory block as activated one at a time during a refresh operation for the memory cells in the non-edge memory block, wherein the at least one edge memory block is configured such that the refresh operation involves a plurality of word lines, and the refresh execution circuit is configured to perform the refresh operation on the memory cells in the edge memory block in a first and second stage, and configured to activate a first number of the plurality of word lines one at a time in the first stage and to activate a second number of the plurality of word lines one at a time in the second stage, such that each of the plurality of word lines is activated during the refresh operation.

2. The device of claim 1, wherein the first number equals the second number.

3. The device of claim 2, wherein the first number equals a number of word lines activated one at a time during the refresh operation for the memory cells in the non-edge memory block.

4. The device of claim 1, wherein the first number is greater than the second number.

5. The device of claim 4, wherein the first number equals a number of word lines activated one at a time during the refresh operation for the memory cells in the non-edge memory block.

6. The device of claim 1, wherein the second number is greater than the first number.

7. The device of claim 6, wherein the second number equals a number of word lines activated one at a time during the refresh operation for the memory cells in the non-edge memory block.

8. A semiconductor memory device, comprising:
a memory cell array having at least one memory bank, the memory bank being divided into memory blocks such that the memory blocks have a block position including at least one edge memory block at an edge of the memory bank and at least one non-edge memory block, each memory block including a plurality of memory cells, each memory cell associated with at least one bit line and at least one word line; and
a refresh execution circuit configured to activate a less than or equal number of word lines one at a time during a refresh operation for the memory cells in the edge memory block as activated one at a time during a refresh operation for the memory cells in the non-edge memory block, the refresh executing circuit including,
a cell block position decision circuit configured to determine whether the refresh operation is for the at least one edge memory block or the at least one non-edge memory block based on a refresh address, and to output a cell block position decision signal based on the determination;
a counter configured to receive refresh pulses and to count the refresh pulses based on the cell block position decision signal, and configured to output a count based on counting the refresh pulses;
a multiplexer configured to output one of the count and the refresh pulses based on the cell block position decision signal; and
a refresh counting circuit including a plurality of binary counters configured to generate the refresh address based on an output of the multiplexer.

9. The device of claim 8, wherein the counter is enabled if the refresh address is for the at least one edge memory block, and disabled if the refresh address is for the at least one non-edge memory block.

10. The device of claim 8, wherein the cell block position decision circuit is configured to perform a logical OR operation on at least a portion of outputs from the plurality of binary counters to generate the cell block position decision signal.

11. The device of claim 1, wherein the memory cell array has an open bit line structure.

12. A refresh execution circuit configured to perform a refresh operation in a semiconductor memory device having a memory cell array, the memory cell including at least one memory bank having an at least one edge memory block at an edge of the memory bank and an at least one non-edge memory block, each memory block including a plurality of memory cells, each memory cell associated with at least one bit line and at least one word line, the refresh execution circuit comprising:
a cell block position decision circuit configured to determine whether the refresh operation is for the at least one edge memory block or the at least one non-edge memory block based on a refresh address, and to output a cell block position decision signal based on the determination of the block position;
a counter configured to receive refresh pulses and to count the refresh pulses based on the cell block position decision signal, and configured to output a count based on counting the refresh pulses;
a multiplexer configured to output one of the count and the refresh pulses based on the cell block position decision signal; and
a refresh counting circuit including a plurality of binary counters configured to generate the refresh address based on an output of the multiplexer.

13. The device of claim 12, wherein the counter is configured to output the count if the refresh address is for the at least one edge memory block, and configured to output a no count if the refresh address is for the at least one non-edge memory block.

14. The device of claim 12, wherein the cell block position decision circuit is configured to perform a logical OR operation on at least a portion of outputs from the plurality of binary counters, and configured to generate the cell block position decision signal.

15. The device of claim 12, wherein the memory cell array has an open bit line structure.

16. A data processing system comprising:
a main board;
a central processing unit mounted on the main board; and
a memory device electrically coupled to the central processing unit, the memory device having a memory cell array, the memory cell including at least one memory bank having an at least one edge memory block at an edge of the memory bank and an at least one non-edge memory block, each memory block including a plurality of memory cells, each memory cell associated with at least one bit line and at least one word line, wherein a less than or equal number of word lines one at a time during a refresh operation for the memory cells in the edge memory block as activated one at a time during a refresh operation for the memory cells in the non-edge memory block, wherein the at least one edge memory block is configured such that the refresh operation involves a plurality of word lines, and the memory device is configured to perform the refresh operation on the memory cells in the edge memory block in a first and second stage, and configured to activate a first number of the plurality of word lines one at a time in the first stage and to activate a second number of the plurality of word lines one at a time in the second stage, such that each of the plurality of word lines is activated during the refresh operation.

17. The data processing system of claim 16, wherein the memory device is a volatile semiconductor memory device.

18. The data processing system of claim 16, wherein the memory device is dynamic random access memory (DRAM).

19. The device of claim 8, wherein the memory cell array has an open bit line structure.

* * * * *